United States Patent
Aoki et al.

(10) Patent No.: US 9,101,981 B2
(45) Date of Patent: Aug. 11, 2015

(54) METHOD OF MANUFACTURING METAL COMPOSITE MATERIAL, METAL COMPOSITE MATERIAL, METHOD OF MANUFACTURING HEAT DISSIPATING COMPONENT, AND HEAT DISSIPATING COMPONENT

(75) Inventors: Syuzo Aoki, Nagano (JP); Takuya Oda, Nagano (JP); Takuya Kurosawa, Nagano (JP); Shoji Koizumi, Nagano (JP); Hidekazu Takizawa, Nagano (JP); Yutaka Komatsu, Nagano (JP); Shinichi Anzawa, Nagano (JP)

(73) Assignees: SHINKO ELECTRIC INDUSTRIES CO., LTD., Nagano-shi, Nagano (JP); NAGANO PREFECTURE, Nagano-shi, Nagano (JP)

( * ) Notice: Subject to any disclaimer, the term of this patent is extended or adjusted under 35 U.S.C. 154(b) by 172 days.

(21) Appl. No.: 13/315,546

(22) Filed: Dec. 9, 2011

(65) Prior Publication Data
US 2012/0189839 A1   Jul. 26, 2012

(30) Foreign Application Priority Data
Jan. 26, 2011   (JP) .................. 2011-014183

(51) Int. Cl.
| | | |
|---|---|---|
| *B32B 9/00* | (2006.01) | |
| *B22F 7/08* | (2006.01) | |
| *C01B 31/02* | (2006.01) | |
| *C22C 1/04* | (2006.01) | |
| *C22C 1/10* | (2006.01) | |
| *C22C 26/00* | (2006.01) | |
| *F28F 21/02* | (2006.01) | |
| *F28F 21/08* | (2006.01) | |
| *F28D 15/04* | (2006.01) | |
| *C01B 31/04* | (2006.01) | |

(52) U.S. Cl.
CPC .................. *B22F 7/08* (2013.01); *C01B 31/022* (2013.01); *C22C 1/0425* (2013.01); *C22C 1/1084* (2013.01); *C22C 26/00* (2013.01); *F28D 15/046* (2013.01); *F28F 21/02* (2013.01); *F28F 21/08* (2013.01); *C01B 31/0438* (2013.01); *C01B 2202/00* (2013.01); *F28F 2245/02* (2013.01); *F28F 2255/18* (2013.01); *H01L 2924/0002* (2013.01); *Y10T 428/25* (2015.01); *Y10T 428/256* (2015.01); *Y10T 428/30* (2015.01)

(58) Field of Classification Search
CPC .......................... C01B 31/022; C01B 2202/00
USPC .................... 428/408; 423/447.1, 447.2, 448; 977/742
See application file for complete search history.

(56) References Cited

U.S. PATENT DOCUMENTS

| | | | | |
|---|---|---|---|---|
| 2002/0038704 | A1* | 4/2002 | Houle et al. .................. | 165/185 |
| 2005/0186104 | A1* | 8/2005 | Kear et al. ...................... | 419/11 |

FOREIGN PATENT DOCUMENTS

| | | |
|---|---|---|
| JP | 2003-222481 | 8/2003 |
| JP | 2005-180871 | 7/2005 |
| JP | 2007-016262 | 1/2007 |
| JP | 2007-224359 | 9/2007 |

OTHER PUBLICATIONS

Saravanan, Journal of Minerals & Materials Characterization & Engineering, vol. 9, No. 11, pp. 1027-1035; 2010 (publication date Sep. 20, 2010 from journal website).*

* cited by examiner

*Primary Examiner* — Daniel H Miller
(74) *Attorney, Agent, or Firm* — Drinker Biddle & Riddle (57) ABSTRACT

A method of manufacturing a metal composite material includes applying a mechanical impact force to a carbon material and a metal powder at such an intensity as capable of pulverizing the carbon material, thereby adhering the carbon material to a surface of the metal powder.

8 Claims, 11 Drawing Sheets

EVAPORATION PORTION | HEAT INSULATING PORTION | CONDENSATION PORTION

FIG. 8

EVAPORATION PORTION | HEAT INSULATING PORTION | CONDENSATION PORTION

METHOD OF MANUFACTURING METAL COMPOSITE MATERIAL, METAL COMPOSITE MATERIAL, METHOD OF MANUFACTURING HEAT DISSIPATING COMPONENT, AND HEAT DISSIPATING COMPONENT

TECHNICAL FIELD

The present disclosure relates to a method of manufacturing a metal composite material, a metal composite material, a method of manufacturing a heat dissipating component, and a heat dissipating component.

RELATED ART

In recent years, along with improvement in the performance and increase in the operation speed of semiconductor devices used for CPU (Central Processing Unit), GPU (Graphics Processing Unit) or the like, the amount of heat generated from the semiconductor devices have been increased year by year. The temperature of semiconductor devices is increased along with increase in the amount of generated heat, and this results in a problem such as erroneous operation.

Then, for avoiding occurrence of such a problem, various techniques for dissipating heat and cooling the semiconductor devices have been proposed. For example, there has been proposed means of attaching a heat diffusion plate (heat spreader) comprising a highly heat conductive metal to a semiconductor device and attaching a heat sink having heat dissipation fins to the heat spreader. In this case, heat generated from the semiconductor device to be cooled is once diffused to the heat spreader and then dissipated by the heat sink.

Further, there has been also proposed means of interposing, between the heat spreader and the heat sink, a heat pipe or a vapor chamber in which a working fluid is sealed in a tightly closed vessel and a capillary structure (wick) is disposed to the inner wail and dissipating heat and cooling the semiconductor devices via the heat spreader by latent heat of evaporation of the working fluid. In this case, heat generated from the semiconductor devices is once diffused to the heat spreader, the heat pipe or the vapor chamber receives the heat from the heat spreader and the working fluid is evaporated while depriving the latent heat. Then, when the vapors of the working fluid flow toward the low temperature side, the heat generated from the semiconductor devices is diffused and, as a result, the heat generating body is cooled.

Patent Documents 1 and 2 are disclosed as the related art relevant to the existent techniques described above.
[Patent Document]
[Patent Document 1] JP-A-2005-180871
[Patent Document 2] JP-A-2003-222481

In the heat dissipating component having a heat dissipating or heat conducting function as described above, highly heat conductive metals (for example, copper or aluminum) have been used as the material in order to improve the heat dissipating efficiency. Further, in the heat pipe or the vapor chamber, a wick formed of a fine copper wire braid or a wick formed of a sintered body of copper powder is used to increase the area of contact with the working fluid and improve heat dissipating efficiency. However, since such a metal has prescribed heat conductivity, the heat dissipating efficiency cannot be improved further in view of the material and still leaves a room for improvement in this respect.

SUMMARY

Exemplary embodiments provide a method of manufacturing a metal composite material, a metal composite material and a method of manufacturing a heat dissipating component, and a heat dissipating component, which can improve the heat dissipating efficiency.

A method of manufacturing a metal composite material according to an exemplary embodiment includes:
an adhesion step of applying a mechanical impact force to a carbon material and a metal powder at such an intensity as capable of pulverizing the carbon material, thereby adhering the carbon material to a surface of the metal powder.

According to the method, a carbon material is adhered to the surface of a metal powder in an adhesion step. Since the carbon material having higher heat conductivity than the metal powder is exposed to the surface of the metal composite material, the heat conductivity of the metal composite material can be improved.

Further, in the adhesion step, at least a portion of the carbon material is pulverized and the hydrophilicity of the carbon material is improved by the pulverization. Since the carbon material improved in the hydrophilicity is exposed to the surface of the metal composite material, the hydrophilicity of the metal composite material can be improved. Accordingly, when the metal composite material is used as the wick for the heat pipe or the vapor chamber, the working fluid can be penetrated also in narrow gaps and the area of contact with the working fluid can be increased to obtain a large heat dissipating area. Thus, the heat dissipating efficiency can be improved.

A metal composite material according to an exemplary embodiment includes:
a metal powder; and
a carbon material which is activated at its surface and thereby is provided with hydrophilicity,
wherein the carbon material is adhered to the metal powder and the adhered carbon material is exposed to a portion of the surface of the metal powder.

With the constitution described above, the heat conductivity of the metal composite material can be improved by exposing the carbon material having higher heat conductivity than the metal powder to the surface of the metal composite material. Further, since the carbon material provided with hydrophilicity is exposed to the surface of the metal composite material, the hydrophilicity of the metal composite material can be improved. Accordingly, when the metal composite material is used as a wick of a heat pipe or a vapor chamber, a working fluid can be penetrated also in narrow gaps and the area of contact of the working fluid to obtain a large heat dissipating area. Thus, the heat dissipating efficiency can be improved.

A method of manufacturing a heat dissipating component according to an exemplary embodiment includes:
an adhesion step of applying a mechanical impact force to a carbon material and a metal material to such an extent of intensity as capable of pulverizing the carbon material thereby forming a metal composite material where the carbon material is adhered to a surface of the metal powder; and
a sintering step of disposing the metal composite material to a surface or an inner space of a heat dissipating component and heating the heat dissipating component, thereby adhering the metal composite material to the surface or an inner wall surface of the heat dissipating component.

According to the method, a carbon material is adhered to the surface of a metal powder in an adhesion step. Since the carbon material having higher heat conductivity than the metal powder is exposed to the surface of the metal composite material, the heat conductivity of the metal composite material can be improved. Further, in the adhesion step, at least a portion of the carbon material is pulverized and the hydrophilicity of the carbon material is improved by the pulverization. Since the carbon material improved in the hydrophilicity is exposed to the surface of the metal composite material, the hydrophilicity of the metal composite material can be improved. Then, in the sintering step, such metal composite material is adhering to the surface or the inner wall surface of the heat dissipating component, the heat conductivity and the hydrophilicity of the metal composite material can be improved.

A heat dissipating component according to an exemplary embodiment includes:

a metal composite material adhered to a surface or an inner wall surface of the heat dissipating component, where the metal composite material has a metal powder, and a carbon material which is activated at its surface and thereby is provided with hydrophilicity, and the carbon material is adhered to the metal powder, and the adhered carbon material is exposed to a portion of the surface of the metal powder.

With the constitution described above, the heat conductivity of the metal composite material can be improved by exposing the carbon material having higher heat conductivity than the metal powder to the surface of the metal composite material. Further, since the carbon material provided with hydrophilicity is exposed to the surface of the metal composite material, the hydrophilicity of the metal composite material can be improved. Furthermore, such metal composite material is adhering to the surface or the inner wall surface of the heat dissipating component, the heat conductivity and the hydrophilicity of the metal composite material can be improved.

According to the method of manufacturing a metal composite material, the metal composite material and the method of manufacturing the heat dissipating component, and the heat dissipating component, the heat dissipating efficiency can be improved.

DETAILED DESCRIPTION

A preferred embodiment is to be described with reference to FIG. 1 to FIG. 16.

(Metal Composite Material)

In a metal composite material of this embodiment, a carbon material activated at the surface and provided with hydrophilicity is adhered to a metal powder and the adhered carbon material is exposed to a portion of the surface of the metal composite material. Specifically, in the metal composite material, a carbon material pulverized by mechanical energy and a carbon material which is not pulverized yet (which will be later called as "not-yet-pulverized carbon material") are adhered to the surface of the metal powder and just below the surface of a metal powder, and such carbon materials are exposed to a portion of the surface of the metal composite material. More specifically, in the metal composite material, the surface is formed in a concavo-convex shape with the carbon material described above and the crystal grains of the metal powder.

As the metal powder, a powder of metal, for example, copper (Cu), silver (Ag), gold (Au), aluminum (Al), lead (Pb), tin (Sn), and indium (In), or a powder of an alloy (solder, etc.) containing at least one of such metals can be used. For the metal material, metal powders of an identical kind and different grain sizes may be used in admixture. By using a metal powder of high heat conductivity, for example, a powder of Cu, Ag, Au, Al, etc., a metal composite material of higher heat conductivity can be obtained.

As the carbon material, amorphous carbon, carbon fiber, or nanocarbon can be used. As the nanocarbon, crystalline carbon materials such as carbon nanotube (CNT), graphite, graphene, fullerene, and nanodiamond can be used. The carbon materials may be used each alone or in combination of a plurality kinds of them. By using highly crystalline nanocarbon, for example, a carbon nanotube or graphite, a metal composite material of higher heat conductivity can be obtained.

The content of the carbon material based on the metal composite material is, for example, 0.1 mass % to 5 mass %. The content of the carbon material in the metal composite material can be measured by morphological observation under ultra-high resolution power FE-SEM or transmission type electron microscope or by elemental analysis or by analysis according to JIS Z 2615 "general rules for determination of carbon in metallic materials".

(Manufacturing Method of Metal Composite Material)

A method of manufacturing a metal composite material having the constitution described above is to be described with reference to FIG. 1 to FIG. 6.

Figure 1:
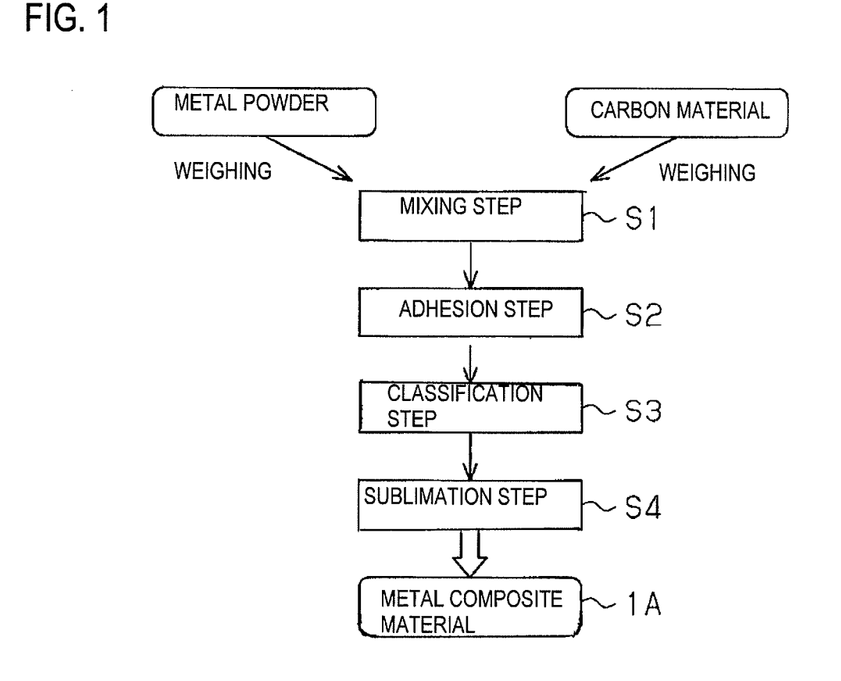
FIG. 1 is a flow chart showing a method of manufacturing a metal composite material.

The method of manufacturing a metal composite material includes a mixing step of mixing a metal powder and a carbon material (step S1), an adhesion step of adhering the carbon material to the metal powder (S2), a classification step of classifying to remove not-adhered particles (step S3), and a sublimation step of partially subliming a metal powder thereby exposing a portion of the carbon material to the surface (step S4). A method of manufacturing a metal composite material by using a copper powder as the metal powder and carbon nanotubes as the carbon material is to be described.

(Mixing Step)

At first, in the mixing step, a copper powder and a carbon nanotube are mixed (step S1). In the step, while the mixing ratio of the copper powder and the carbon nanotube is not restricted particularly, they are mixed, for example, such that 0.1 mass % to 5 mass % of carbon nanotubes are contained in the mixture. Further, while the shape and the grain size of the particle of the copper powder are not restricted particularly, a copper powder having a grain size of 40 µm to 3 mm is used. With the mixing ratio and the grain size described above, the carbon nanotubes can be preferably adhered to the copper powder in the next adhesion step.

The carbon nanotube has a cylindrical structure comprising a graphite sheet in a hexagonal network shape (graphene). The carbon nanotube may be single-wall carbon nanotube or multi-wall carbon nanotube. Further, it may be a fullerene-incorporated carbon nanotube. A manufacturing method of the carbon nanotube is not particularly restricted and includes, for example, an arc discharge method, a laser ablation method, and a chemical vapor deposition method.

(Adhesion Step)

Then, in the adhesion step, mechanical impact is applied to the mixture of the copper powder and the carbon nanotubes thereby adhering the carbon nanotubes to the surface of the copper powder and in the inside just below the surface of the copper powder (S2). The method of applying the mechanical impact includes, for example, a method of using a high speed collision device 10 shown in FIG. 2. The structure of the high speed collision device 10 is to be described at first.

Figure 2:
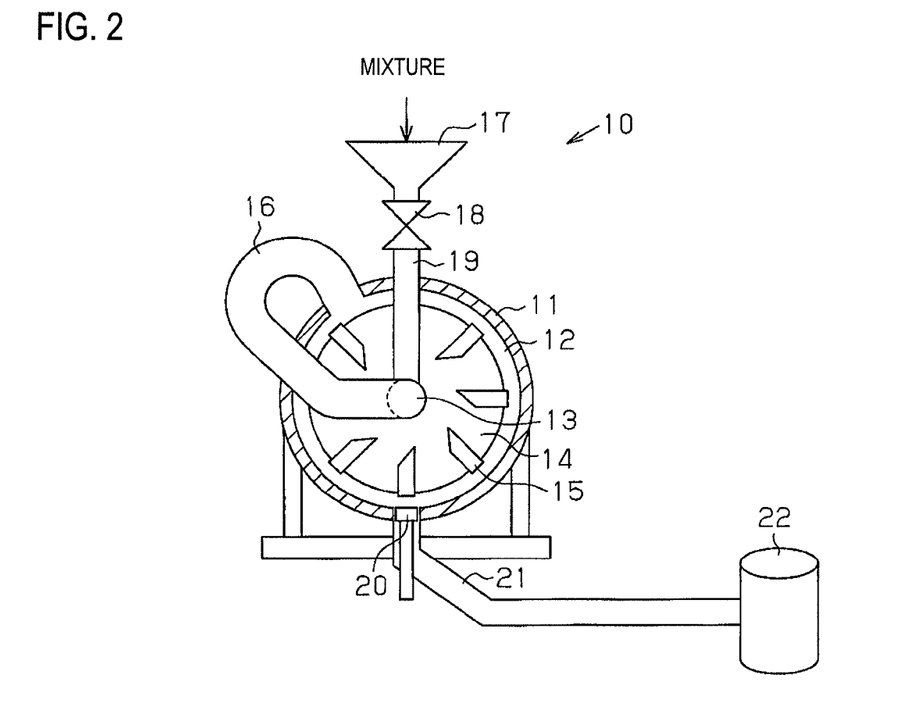
FIG. 2 is a schematic view showing high speed collision device.

The high speed collision device 10 has an impact chamber 12, a rotary shaft 13 and a disk-like rotor 14. The impact chamber 12 comprises a cylindrical stator 11 and covers (not illustrated) closing both end faces of the stator 11. The disk-like rotor 14 is rotationally pivoted by the rotary shaft 13 in the impact chamber 12. A plurality of blades 15 are secured radially to the circumference of the disk of the rotor 14. Further, the high speed collision device 10 has a circulation tube 16 opened at one end to a portion of the inner wall of the stator 11 and opened at the other end to a portion of the cover thereby forming a closed circuit. A material hopper 17 for supplying a raw material is connected to the circulation tube 16 via an on-off valve 18 and a material supply chute 19. Further, the high speed collision device 10 has a discharge chute 21 which is opened and closed by a discharge valve 20 provided to a portion of the stator 11. The discharge chute 21 is connected to a powder recovery device 22 for recovering the powder after treatment.

Then, a treatment method in the adhesion step using the high speed collision device 10 having the constitution described above is to be described.

At first, in an atmosphere where carbon nanotubes are not put to oxidation combustion, for example, in an atmosphere of an inert gas (argon gas, etc.) or nitrogen gas, the copper powder and the carbon nanotubes mixed in the mixing step are supplied by the material supply chute 19 into the impact chamber 12. In this step, the rotor 14 is rotated by the rotary shaft 13 at a circumferential speed of about 50 m/s to 150 m/s for 1 to 3 minutes by driving means (not illustrated) in a state of closing the on-off valve 18 and the discharge valve 20. Thus, the copper powder and the carbon nanotubes are scattered while being rotated at a high speed in the impact chamber 12 and in this course, collide under rotation against the surface of the stator 11 and the blade 15. The copper powder and the carbon nanotubes are circulated through the circulation tube 16 opened to the stator 11 and then supplied again to the impact chamber 12. As described above, the copper powder and the carbon nanotubes are circulated by a plurality of cycles between the impact chamber 12 and the circulation tube 16 along with the rotation of the rotor 14. Due to repetitive collision against the stator 11 and the rotor 14 during the process, an intense mechanical energy is generated at the surface of the carbon nanotubes and a portion of the carbon nanotubes is pulverized. In the thus pulverized carbon nanotubes, mechanical energy of pulverization, etc. is accumulated in the state of the chemical energy at the surface and, as a result, change of the physicochemical property is induced to increase the surface activity (mechanochemical effect). By the mechanochemical effect, hydrophilicity is increased in the carbon nanotubes after pulverization.

Figure 3:
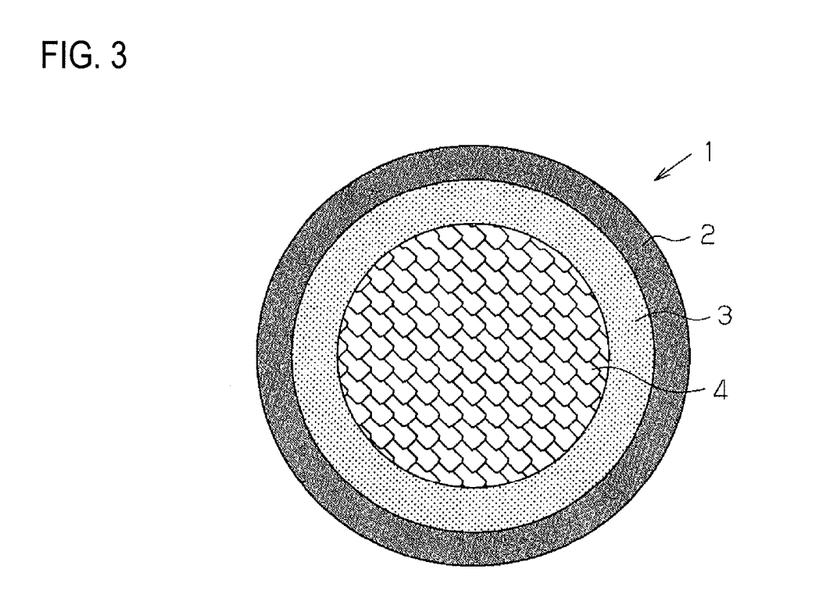
FIG. 3 is a schematic view showing a cross sectional structure of a metal composite material after an adhesion step.
Figure 4:
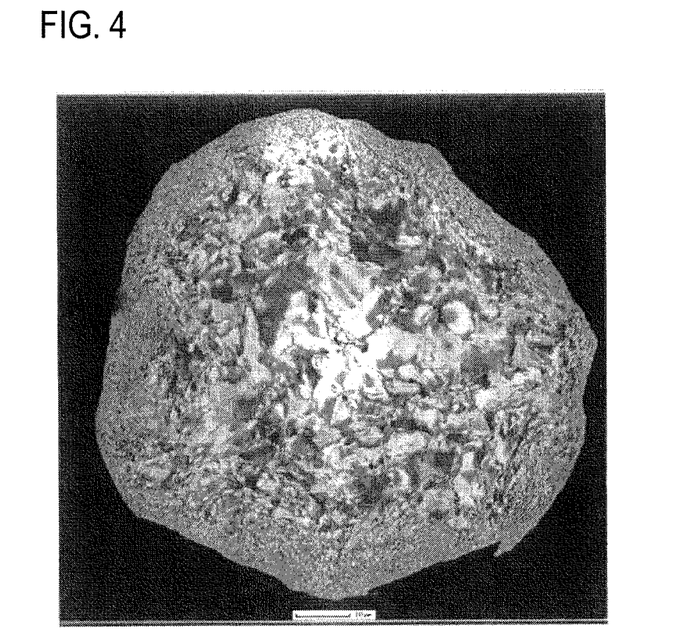
FIG. 4 is a scanning ion microscopic image of a cross sectional structure of a metal composite material after the adhesion step.
Figure 5:
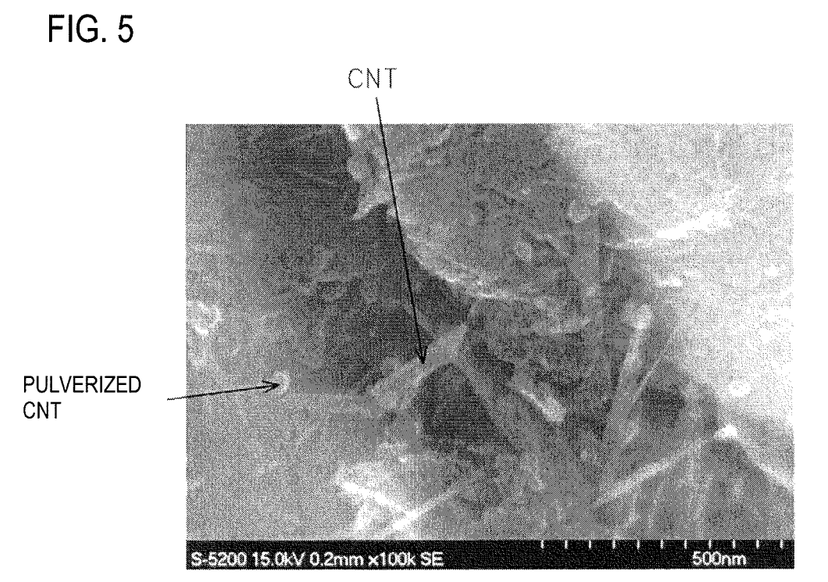
FIG. 5 is an ultra-high resolution FE-SEM image of the metal composite material after the adhesion step.

During circulation between the impact chamber 12 and the circulation tube 16, an impact force between particles to each other is applied to the copper powder and the carbon nanotubes in addition to the impact force against the stator 11 and the blade 15 described above. Due to the mechanical impact force, the carbon nanotubes are adhered to the surface of the copper powder and, further, the carbon nanotubes adhered to the surface of the copper powder are hit by collision between the copper powder to each other and the carbon nanotubes are buried just below the surface of the copper powder. That is, the carbon nanotubes are adhered to the surface of the copper powder and just below the surface of the copper powder by the mechanical impact force given by the rotation of the rotor 14. Thus, a metal composite material 1 comprising composite carbon nanotubes and copper powder is formed, and an adhesion layer 2 where the crystal grains of the copper powder and the carbon nanotube are adhered is formed at the outermost surface of the metal composite material 1 as shown in FIGS. 3 and 4. As shown in FIG. 5, not-yet-pulverized carbon nanotubes and pulverized carbon nanotubes are buried in the adhesion layer 2. The region just below the surface of the metal composite material where the carbon nanotubes are buried (adhesion layer 2) is in a range, for example, of about from 5 µm to 12 µm from the surface of the metal composite material 1. Further, as shown in FIG. 3 and FIG. 4, a fine crystal structure 3 finely grained from mother crystals of the copper powder by the mechanical impact force described above is formed from the side of the adhesion layer 2 toward the center. Further, the mother crystal structure 4 of the not pulverized copper powder is formed from the side of the fine crystal structure 3 toward the center.

Then, after lapse of a predetermined time, a sample containing the metal composite material 1 after the treatment is recovered through the discharge chute 21 to the recovery device 22 by opening the discharge valve 20 shown in FIG. 2.

In the adhesion step described above, since the carbon nanotubes are buried in the copper powder, detachment of the carbon nanotubes from the copper powder is suppressed and a homogeneous composite material can be obtained in the subsequent step (sublimation step).

(Classification Step)

As shown in FIG. 1, for recovering only the metal composite material 1, samples other than the metal composite material 1 is classified and removed in the next classification step (step 3). Specifically, not adhered carbon nanotubes, not adhered copper powder, and copper powder formed by adhesion of copper powder to each other are removed by classification. The classification step can be performed, for example, by an elbow jet air classifier.

(Sublimation Step)

Then, in a sublimation step, the metal composite material 1 recovered by the classification step is heated to sublimate the surface of the metal composite material 1, that is, a portion of copper in the adhesion layer 2 (step 4). Specifically, the metal composite material 2 is heated in an atmosphere where the carbon nanotubes are not put to oxidative combustion (for example, in vacuum, inert gas, or nitrogen gas) under sublimation condition for copper to sublimate a portion of copper in the adhesion layer 2. More specifically, the metal composite material 1 is heated, for example, in an atmosphere at vacuum degree of $1 \times 10^{-3}$ Pa to $1 \times 10^{-4}$ Pa and at a temperature of 800° C. to 1100° C. in a vacuum furnace to sublimate the portion of the copper in the adhesion layer 2 and to expose the carbon nanotubes in the adhesion layer 2 to a portion of the surface of the metal composite metal 1 (for example, for about 1% to 70% of the surface area). The sublimation time is not particularly restricted and may be set such that the carbon nanotubes are exposed for 1% to 70% of the surface of the metal composite material 1. The extent of the exposure of the carbon nanotubes in the metal composite material 1 can be measured, for example, by texture observation by an ultra-high resolution power FE-SEM or an electron microscope.

Figure 6:
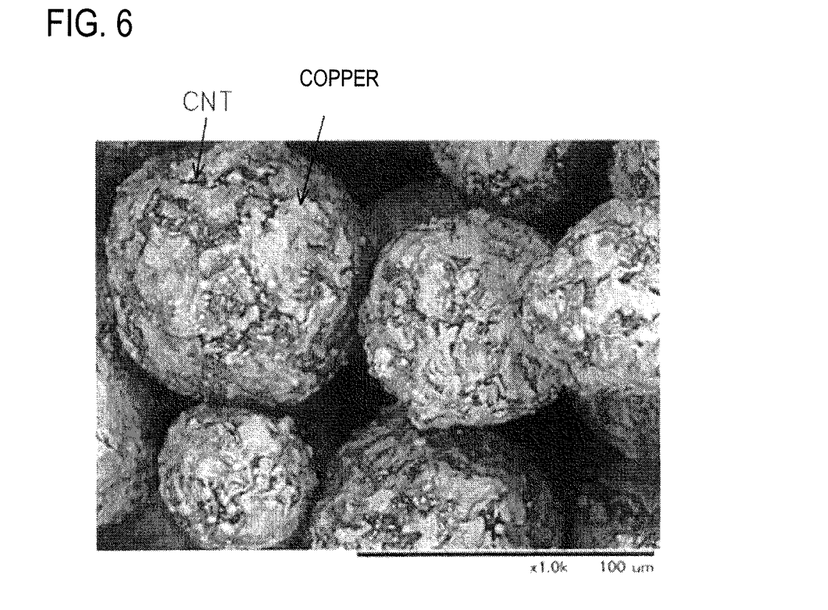
FIG. 6 is a scanning electron microscopic image of the metal composite material after a sublimation step.

As shown in FIG. 6, the metal composite material 1A obtained after the sublimation step described above is formed in a concavo-convex shape at the surface thereof with the carbon nanotube and copper, and the surface area is increased more than that of the copper powder before it is formed into a composite state. Since carbon nanotubes having a heat conductivity about three to four times as high as copper are exposed to the surface of the metal composite material, heat tends to transfer on the surface of the metal composite material 1A and the heat conductivity of the metal composite material 1A can be improved outstandingly compared with that of the copper powder before it is formed into a composite state. Further, the carbon nanotubes exposed to the surface of the metal composite material contain the carbon nanotubes after pulverization described above, that is, carbon nanotubes of high hydrophilicity. Accordingly, the hydrophilicity of the metal composite material 1A can be improved greatly compared with that of the copper powder before it is formed into a composite state described above. Further, since the surface area is increased by concavo-convex shape of the surface of the metal composite material, the area of contact with the working fluid can be extended greatly when the metal composite material 1A is applied, for example, to the heat pipe or the vapor chamber. Thus, the heat receiving efficiency and the heat dissipating efficiency can be improved.

(Application Example)

As has been described above, since the metal composite material 1A (or metal composite material 1) is excellent in the heat conductivity and the hydrophilicity, the material can be applied extensively to heat dissipating components having heat dissipating or heat conductive function such as heat pipe, vapor chamber, heat spreader, heat sink, or heat exchanger. Specific examples of applying the metal composite material 1A to such heat dissipating components are described below.

(Application Example 1)

At first, description is to be made to a case of applying the metal composite material 1A described above to a heat pipe.

Figure 7:
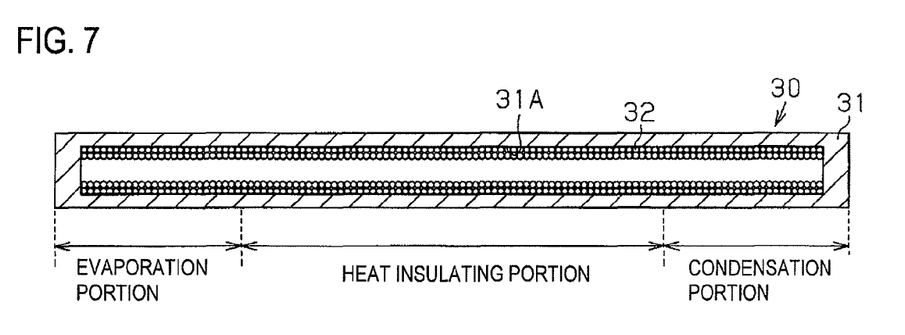
FIG. 7 is a cross sectional view showing a heat pipe.

As the material for the heat pipe, copper is used typically. As shown in FIG. 7, a heat pipe 30 has a structure in which a condensible fluid (for example, water or alcohol) is sealed as a working fluid in a tightly closed container 31. The heat pipe 30 is constituted such that the working fluid is evaporated in an evaporation portion by the external input of heat, the vapors are caused to flow to a condensation portion and then condensed by heat dissipation thereby transporting heat as the latent heat of the working fluid. In the heat pipe 30, after transporting the heat to the condensation portion, the condensed working fluid in the liquid phase is circulated to the evaporation portion by a capillary pressure of a wick 32. The wick comprises a wick member, for example, powder sintered body, braids, bundles of or fine wires, grooves, etc. A method of using the metal composite material 1A to the wick member is to be described.

(Powder Sintered Body)

Figure 8:
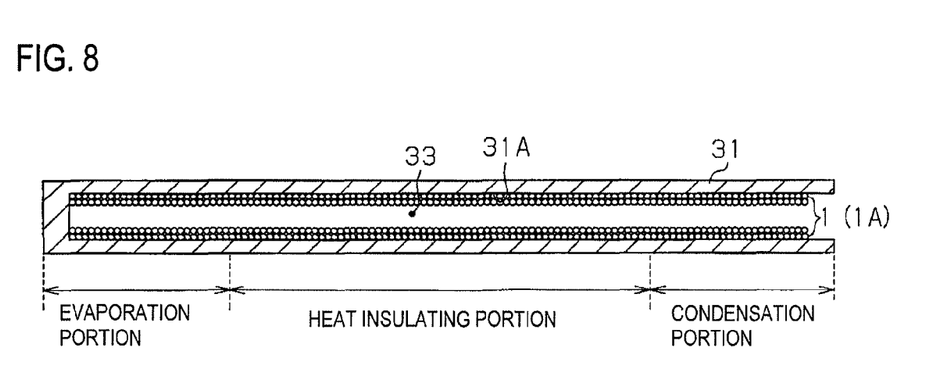
FIG. 8 is a cross sectional view showing a method of manufacturing a heat pipe.
Figure 9A:
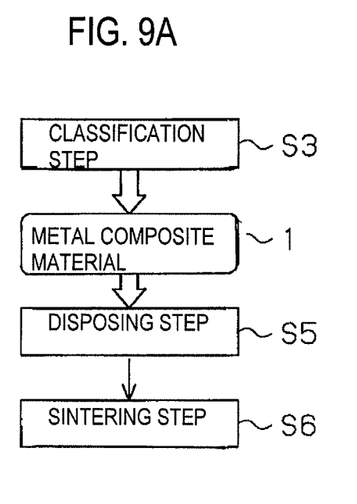
FIGS. 9A and 9B are flow charts showing a method of manufacturing a heat dissipating component.

At first, in the disposing step shown in FIG. 9A, (step S5), the metal composite material 1 recovered in the classification step (S3) is disposed in an inner space 33 of the container 31 sealed at one end (for example, end on the side of the evaporation portion) as shown in FIG. 8. Successively, in the sintering step shown in FIG. 9A (step S6), the container 31 where the metal composite material 1 is disposed is heated by a known sintering method under the sublimation condition for copper thereby sublimating a portion of copper in the adhesion layer 2 of the metal composite material 1 (refer to FIG. 3) and sintering the metal composite materials 1 to each other. Thus, a portion of the carbon nanotubes in the metal composite material 1 is exposed to a portion of the surface of the metal composite material 1 to form a metal composite material 1A where the surface is formed as a concavo-convex shape with the carbon nanotubes and copper. Further, copper exposed to the surface of the metal composite material 1A are bonded to each other to form a sintered body of the metal composite material 1A. In this process, since the inner wall surface 31A of the container 31 is formed of copper, when the sintered body of the metal composite material 1A is formed, the sintered body can be adhered to the inner wall surface 31A of the container 31 simultaneously. In other words, a wick comprising the sintered body of the metal composite material 1A can be formed to the inner wall surface 31A of the container 31.

The sintering step described above can be performed by a known sintering method, for example, a pulsative electric current sintering method, hot press method, vacuum sintering method, gas pressure sintering method, hot isostatic pressure sintering method, etc. The sintering step is performed, preferably, in vacuum or in an inert gas atmosphere. Further, sintering conditions such as sintering temperature may be properly determined in accordance with the sintering method to be adopted, the kind of the metal powder to be used, the sublimation conditions for the metal powder to be adopted (vacuum degree, temperature, etc.).

Then, after the sintering step, the heat pipe 30 can be manufactured by injecting a working fluid into the container 31, evacuating the inside of the container 31, and sealing the end on the side of the condensation.

(Modified Embodiment)

Figure 9B:
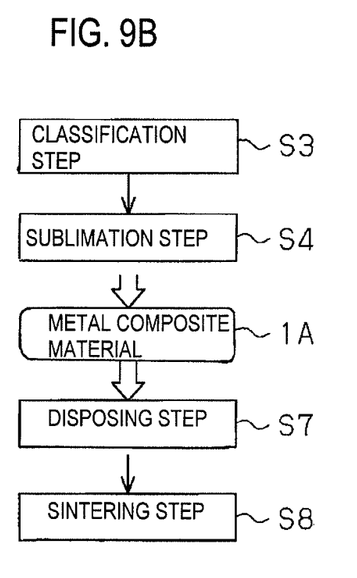

In the application method described above, the metal composite material 1 recovered in the classification step (S3) is disposed in the container 31. However, as shown in FIG. 9B, the metal composite material 1A after the sublimation step (S4) may be disposed in the container 31. Specifically, in the disposing step (S7) shown in FIG. 9B, the metal composite material 1A obtained in the sublimation step (S4) is disposed in the inner space 33 of the container 31 sealed at one end as shown in FIG. 8. In this case, in the sintering step (S8) which will be performed later, the metal composite material 1A is adhered to the inner wall surface 31A of the container 31 by heating the container 31 where the metal composite material 1A is disposed by a known sintering method. In this process, since the copper exposed to the surface of the metal composite material 1A are bonded to each other to form the sintered body of the metal composite material 1A, the sintered body of the metal composite material 1A can be adhered to the inner wall surface 31A of the container 31.

(Braid or Bundle of Fine Wires)

Figure 10:
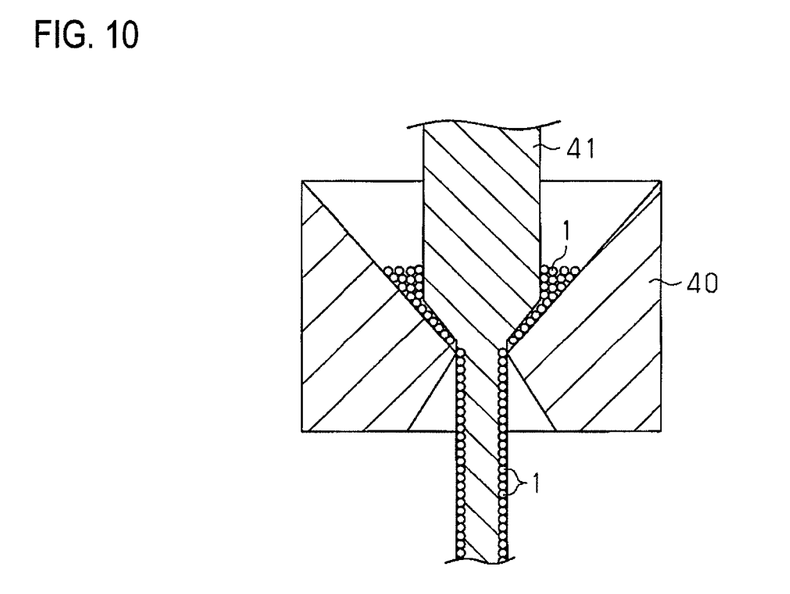
FIG. 10 is a cross sectional view showing a method of manufacturing a wire material for a wick.

As shown in FIG. 10, in a state of supplying the metal composite material 1 recovered by the classification step to the inner surface of the drawing die 40, a pure copper wire 41 is formed into a fine wire by drawing process. Thus, the copper wire is thinned into a desired diameter while the metal composite material 1 is buried to the surface of the copper wire 41. In this process, the metal composite material 1 also functions as a solid lubricant in the drawing process.

Then, in a continuous vacuum furnace, the thinned copper wire 41 is heated under the sublimation condition for copper, to sublimate a portion of copper of the copper wire 41 (specifically, the surface of the metal composite material 1 buried in the copper wire 41). Thus, a portion of the carbon nanotubes in the metal composite material 1 is exposed to a portion of the surface of the copper wire 41 and the surface of the copper wire 41 is formed into a concavo-convex shape with the carbon nanotubes and copper. That is, the metal composite material 1A is formed at the surface of the copper wire 41.

Successively, a wick member comprising a braid can be formed by braiding the thus formed copper wires 41 (fine wires) into a mesh state. Further, the copper wire 41 (fine wire) formed as described above can also be used as the wick member comprising the bundle of fine wires. The wick member comprising the braid and the wick member comprising the bundle of the fine wires can be used also as the wick member for a vapor chamber to be described below.

Then, the wick member comprising the braid or the wick member comprising the bundle of fine wires is disposed in the container sealed at one end. Successively, by heating the container, the wick member is adhered to the inner wall surface of the container. Then, a heat pipe having the wick member comprising the braid and the wick member comprising the bundle of fine wires can be manufactured by injecting a working fluid into the container and evacuating the inside of the container and sealing the other end.

(Groove)

Figure 11:
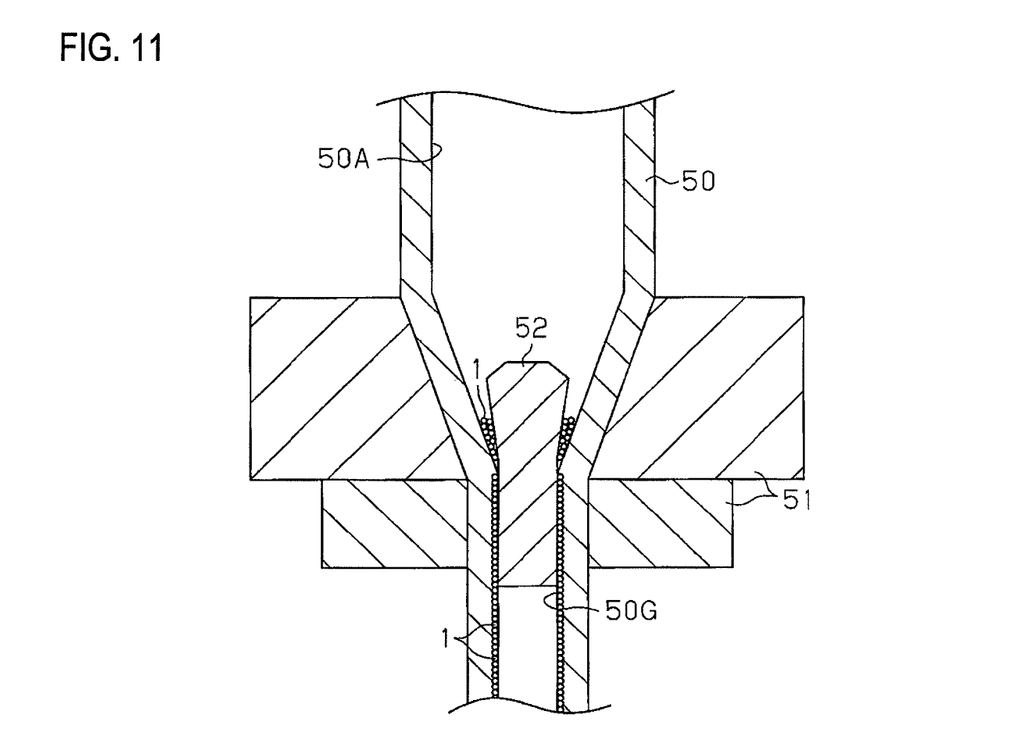
FIG. 11 is a cross sectional view showing a method of manufacturing a heat pipe.
Figure 12:
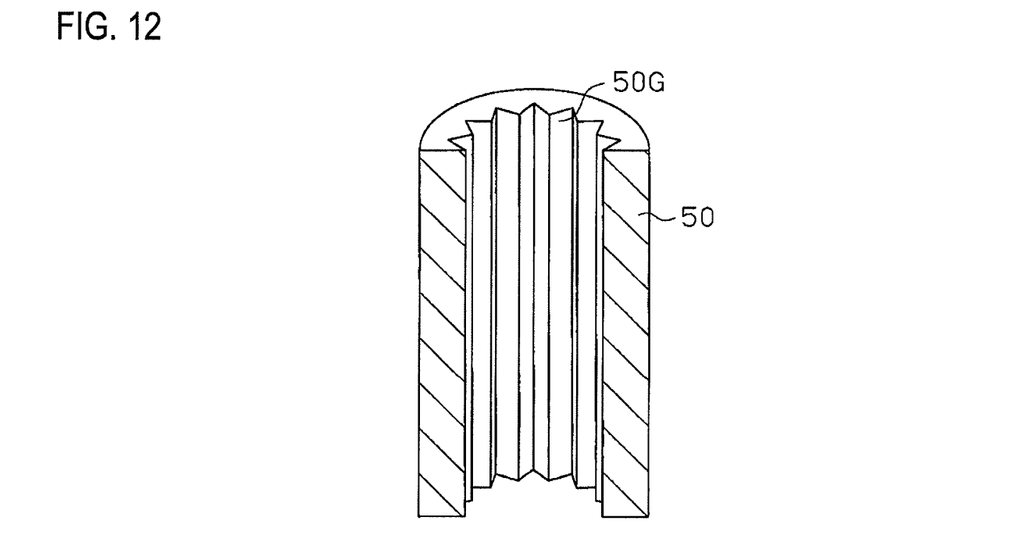
FIG. 12 is a perspective cross sectional view showing grooves.

As shown in FIG. 11, a copper tube 50 is set to a die 51, a plug 52 used for groove fabrication, that is, a plug 52 having grooves and ridges at the outer peripheral surface is inserted into the copper tube 50. Successively, in a state of supplying the metal composite material 1 recovered by the classification step to the gap between the plug 52 and the copper tube 50, drawing or extruding process is applied to the copper tube 50. Thus, as shown in FIG. 12, grooves 50G corresponding to the grooves and the ridges of the plug 52 are formed to the inner wall of the copper tube 50. At the same time, as shown in FIG. 11, the metal composite material 1 is rubbed into the grooves 50G.

Then, in the vacuum furnace, a portion of the surface of copper in the metal composite material 1 rubbed into the grooves 50G of the copper tube 50 is sublimated and a portion of the carbon nanotubes in the metal composite material 1 is exposed to a portion of the surface of the grooves 50G. Thus, a wick of grooves comprising the metal composite material 1A where the surface is formed into a concavo-convex shape with the carbon nanotubes and copper is formed to the inner wall 50A of the copper tube 50.

The copper tube formed as described above is cut into a predetermined length, one end of the copper tube 50 is sealed, a working fluid is injected into the copper tube 50, the inside of the copper tube 50 is evacuated, and the other end of the copper tube 50 is sealed. Thus, a heat pipe having a wick of the grooves comprising the metal composite material 1A can be manufactured.

(Application Embodiment 2)

Then, description is to be made to an example of applying the metal composite material 1A described above to a vapor chamber.

As the material for the vapor chamber, copper is used typically. The vapor chamber is a flat heat pipe. Therefore, the vapor chamber has a structure substantially identical with the heat pipe that transports heat due to phase change between evaporation and condensation of a working fluid sealed in a container. The vapor chamber has a wick for promoting circulation of the working fluid in the same manner as the heat pipe. A method of manufacturing a vapor chamber having a wick comprising a sintered body of the metal composite material 1A is to be described.

Figure 13:
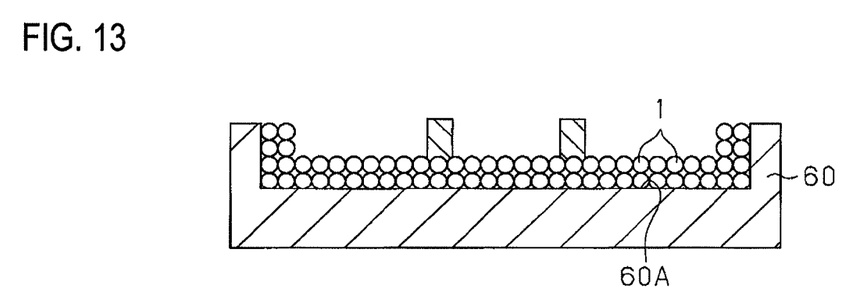
FIG. 13 is a cross sectional view showing a method of manufacturing a vapor chamber.
Figure 14:
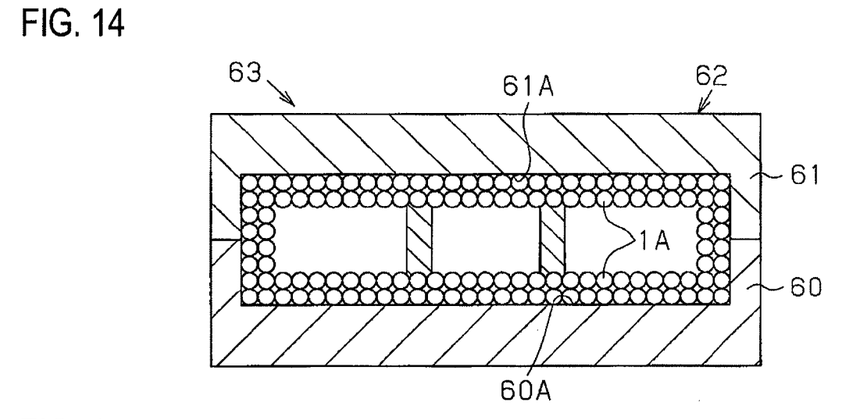
FIG. 14 is a cross sectional view showing a method of manufacturing a vapor chamber.

At first, as shown in FIG. 13, the metal composite material 1 recovered in the classification step is disposed in an internal space of a lower container part 60 and an upper container part 61 (refer to FIG. 14. In FIG. 13, only the lower container part 60 is illustrated). Successively, when the lower container part 60 and the upper container part 61 are heated by a known sintering method under the sublimation condition for copper, a portion of copper in the metal composite material 1 is sublimated and the metal composite materials 1A are sintered to each other (sintering step). Thus, a portion of the carbon nanotubes in the metal composite material 1 is exposed to a portion of the surface of the metal composite material 1 and, as shown in FIG. 14, a metal composite material 1A where the surface is formed into a concavo-convex shape with the carbon nanotubes and copper is formed. Further, copper exposed to the surface of the metal composite material 1A are bonded to each other to form a sintered body of the metal composite material 1A. In this process, since the inner wall surface 60A of the lower container part 60 and the inner wall surface 61A of the upper container 61 are formed of copper, when the sintered body of the metal composite material 1A is formed, the sintered body can be adhered to the inner wall surface 60A of the lower container part 60 and the inner wall surface 61A of the upper container part 61 simultaneously. In other words, the wick comprising the sintered body of the metal composite material 1A can be formed to the inner wall surface 60A of the lower container part 60 and the inner wall surface 61A of the upper container part 61.

Then, as shown in FIG. 14, the outer periphery of the lower container part 60 and the outer periphery of the upper container part 61 are bonded except for the supplying port of the working fluid (not illustrated) by a known method to form a container 62. Successively, a working fluid is injected through the supplying port into the container 62 in an amount about 10% to 50% for the volume of the container 62. Then, a vapor chamber 63 having the wick comprising the sintered body of the metal composite material 1A can be manufactured by evacuating the inside of the container 62 and sealing the supplying port.

(Modified Embodiment)

In the application method described above, the metal composite material 1 recovered in the classification step (step S3) is disposed in the container parts 60, 61. However, the metal composite material 1A after the sublimation step (S4) may be disposed in the container parts 60, 61 in the same manner as the method shown in FIG. 9B.

(Application Embodiment 3)

Then, description is to be made to an example of using the metal composite material 1A described above to a heat spreader.

A heat spreader is a heat diffusing plate for releasing heat generated from the semiconductor device during operation to ambient air. At first, the structure of the heat spreader is to be described.

Figure 15:
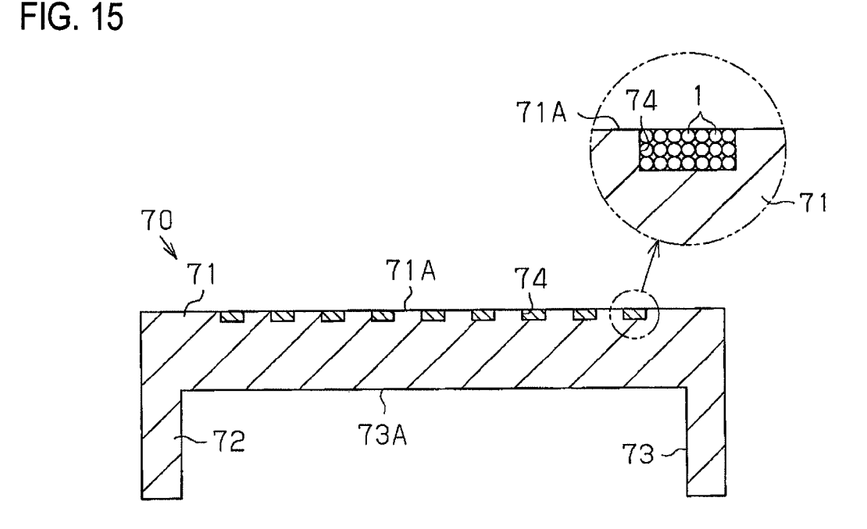
FIG. 15 is a cross sectional view showing a heat spreader.
Figure 16:
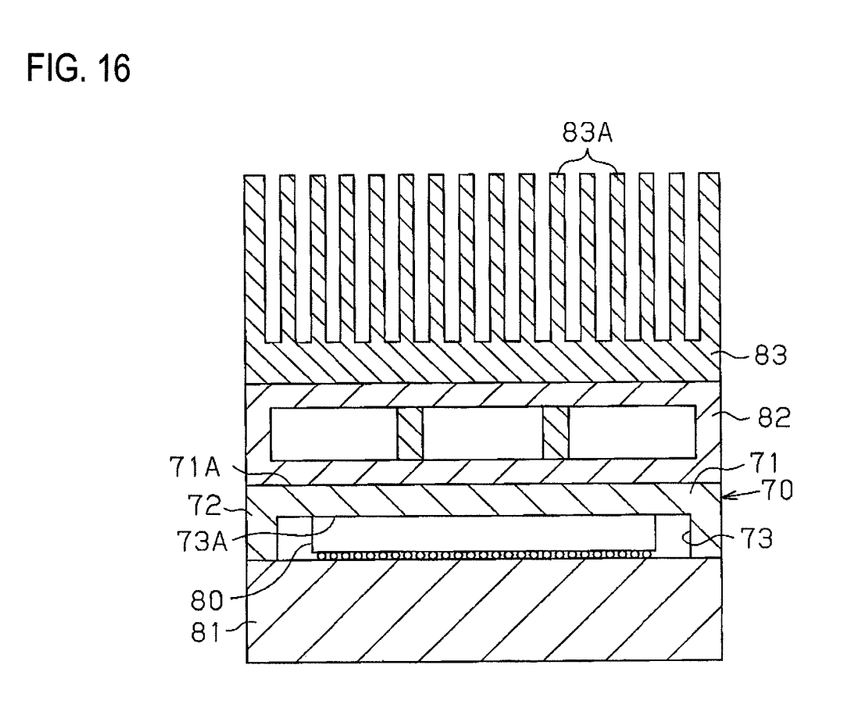
FIG. 16 is a cross sectional view showing an example of the state of using the heat spreader.

As shown in FIG. 15, a heat spreader 70 has a structure mainly comprising a plate part 71 formed into a plate shape and a side wall 72 formed integrally to the periphery of the plate portion 71. The plate portion 71 and the side wall portion 72 define a concave portion 73. As shown in FIG. 16, the bottom 73A of the concave portion 73 of the heat spreader 70 is disposed so as to be in contact with an outer surface of a semiconductor surface 80 (non-device surface), and the side wall portion 72 is fixed on a package 81. For example, a vapor chamber 82 is attached to the upper surface 71A of the plate portion 71 of the heat spreader 70 and a heat sink 83 having heat sink fins 83A is attached on the vapor chamber 82. For the material of the heat spreader 70, copper (Cu) is used typically and, further, nickel (Ni) plating is applied on the surface thereof.

The constitution shown in FIG. 16 is an example of showing the state of using the heat spreader 70. For example, the heat sink 83 may be attached directly to the upper surface 71A of the heat spreader 70 while omitting the vapor chamber 82, or the vapor chamber 82 and the heat sink 83 may also be omitted.

Then, a method of using the metal composite material 1A to the heat spreader 70 constituted as described above is to be described.

At first, as shown in FIG. 15, grooves 74 are fabricated each for a depth of about 0.1 mm to 1 mm at a predetermined pitch to the upper surface 71A of the heat spreader 70. The metal composite material 1 recovered in the classification step described above is filled in the grooves 74. In this step, the metal composite material 1 may be deposited and coated on the upper surface 71A of the heat spreader 70 by a cold spay method.

Successively, the metal composite material 1 is rubbed into the upper surface 71A including the inside of the grooves 74 by friction stir welding to adhere the metal composite material 1 to the upper surface 71A. Then, by heating the heat spreader 70 in which the metal composite material 1 is adhered in a vacuum furnace under the sublimation condition for copper, a portion of copper in the metal composite material 1 is sublimated to expose a portion of the carbon nanotubes in the metal composite material 1 to the upper surface 71A of the heat spreader 70. Thus, the metal composite material 1A where the surface is formed into a concavo-convex shape with the carbon nanotubes and copper can be formed to the upper surface 71A of the heat spreader 70.

(Application Embodiment 4)

Then, description is to be made to an example of using the metal composite material 1A to an ambient air heat dissipating flat plate.

In the same manner as in the heat spreader described above, grooves for a depth of about 0.1 mm to 1 mm are fabricated at a predetermined pitch to the surface of a copper plate, and a metal composite material 1 is filled in the grooves. Successively, the metal composite material 1 is rubbed into the surface of the copper plate by friction stir welding to adhere the metal composite material 1 to the surface of the copper plate. Then, copper in the metal composite material 1 adhered to the copper plate is sublimated in vacuum to expose a portion of the carbon nanotubes in the metal composite material 1 to a portion of the surface of the copper plate, thereby forming a metal composite material 1A where the surface is formed into a concavo-convex shape with the carbon nanotubes and copper to the surface of the copper plate.

The metal composite material 1A may also be formed to the surface of the copper plate by laying the metal composite material 1 throughout the surface of the copper plate and hot press bonding the same by vacuum hot press. In this case, the copper plate, etc. may also be heated, for example, by supplying a high current in a pressurized state. This can improve the manufacturing efficiency.

(Other Application Embodiment)

In products where heat generation gives significant effect on the life and the reliability of products, a technique of cooling and dissipating heat more efficiently has been demanded generally. For example, by applying the metal composite materials 1, 1A to a heat sink plate provided to an LED bulb, the LED bulb can release heat and can be cooled efficiently. This can extend the life of the LED bulb.

Further, in existent small-sized projectors, since heat dissipation giving an effect on the product life cannot be effected sufficiently, they are used while suppressing the brightness. On the contrary, since heat can be dissipated sufficiently by adopting the heat dissipating components using the metal composite materials 1, 1A of this embodiment to the small-sized projectors, it is expected that suppression of the brightness is no more necessary.

Further, heat conductivity or electric conductivity can be improved also in bonding metals or alloys such as solder or indium used for jointing metals by sintering the metal composite material 1, 1A described above at a high pressure to large plane or flat plane. Therefore, it is also possible to manufacture a bonding member used for jointing metals which is improved in the heat conductivity or electric conductivity.

The embodiments described above can provide the following advantageous effects.

(1) In the metal composite material 1, 1A, carbon nanotubes having heat conductivity three times or four times as high as that of copper are exposed to the surface of the metal composite material. Accordingly, heat tends to transfer on the surface of the metal composite material 1, 1A, and the heat conductivity of the metal composite material 1, 1A can be improved outstandingly compared with that of the copper powder before composition.

(2) The carbon nanotubes exposed to the surface of the metal composite material contain carbon nanotubes which are pulverized and thereby activated at the surface, that is, carbon nanotubes having high hydrophilicity. Accordingly, the hydrophilicity of the metal composite material 1, 1A can be improved greatly compared with that of the copper powder before composition. Thus, when the metal composite material 1, 1A is used, for example, to the wick of a heat pipe or a vapor chamber, the working fluid can be penetrated even in narrow gaps and a large heat receiving and heat dissipating area can be obtained. This can improve the heat receiving efficiency and the heat dissipating efficiency.

(3) The surface of the metal composite material 1A is formed into a concavo-convex shape with the carbon nanotubes and copper. Thus, since the surface area of the concavo-convex shape 1A is increased, the area of contact with the working fluid can be increased greatly when the metal composite material 1A is used to the wick of the heat pipe or the vapor chamber. Thus, the heat receiving efficiency and the heat dissipating efficiency can be improved.

(4) By laying the metal composite material 1, 1A where the carbon nanotubes are exposed at the surface throughout the ambient air heat dissipating portion, the degree of emitting ultra-red rays is increased and it is possible to easily release the heat into the ambient air.

(5) By using the metal composite material 1, 1A to various kinds of heat dissipating components, heat can be dissipated efficiently from the heat generating body. Accordingly, this can contribute to improve the reliability and extend the life of the heat generating body. Further, since the size of the heat dissipating components can be decreased, it can contribute also to the size-reduction of device.

The embodiments described above can be practiced in the following properly modified embodiments.

The mixing step in the embodiments described above may be omitted. In this case a metal powder and a carbon material may be mixed, for example, in a high speed collision device 10 uses in the adhesion step.

The classification step in the embodiments described above may be omitted.

The sublimation step in the embodiments described above may be omitted.

The number of rotation of the rotor 14 in the high speed collision device 10 in the embodiments is not particularly restricted. That is, the number of rotation of the rotor 14 may be such a number of rotation as capable of providing, to the metal powder and the carbon material, a mechanical impact force at a strength of pulverizing a portion of the carbon material and adhering the carbon material to the metal powder. Accordingly, the number of rotation of the rotor 14 may be determined appropriately in accordance with the kind (hardness, etc.) of the metal powder and the kind (hardness, etc.) of the carbon material to be used.

The device used in the adhesion step in the embodiments described above is not particularly restricted to the high speed collision device 10 in FIG. 2. That is, the constitution of the device is not particularly restricted providing that the device can provide, to the metal powder and the carbon material, a mechanical impact force at a strength enough to pulverize a portion of the carbon material and adhere the carbon material to the metal powder.

EXAMPLE

The embodiments described above are more specifically described with reference to examples and comparative examples.

Example 1

A copper powder of 100 µm of average grain size, and carbon nanotubes having an average diameter of 10 nm to 25 nm and an average length of 2 µm to 10 µm were prepared and weighed such that the carbon nanotubes were contained by 1.0 mass % in the mixture of the copper powder and the carbon nanotubes. The mechanical impact force was applied to the mixture using the high speed collision device 10 shown in FIG. 2 while rotating the rotor 14 at a circumferential speed of 70 m/s for 3 min in an argon gas atmosphere. The metal composite material obtained by the adhesion step was recovered by classification.

On the other hand, the metal composite material recovered as described above was disposed in a concave portion of a heat spreader sized 30×30 mm and having 3 mm thickness for the plate portion. The heat spreader was placed in a vacuum furnace and a portion of copper was sublimated under the sublimation condition at a vacuum degree of $1 \times 10^{-3}$ Pa and at a temperature of 900° C. to expose the carbon nanotubes by 50% for the surface.

For the heat spreader manufactured as described above, wettability to water was evaluated. The result is shown in FIG. 17. Further, the thermal characteristics of the latent heat of evaporation of the heat spreader manufactured as described above was measured. The result is shown in FIG. 18.

(Evaluation for Wettability)

Figure 17A:
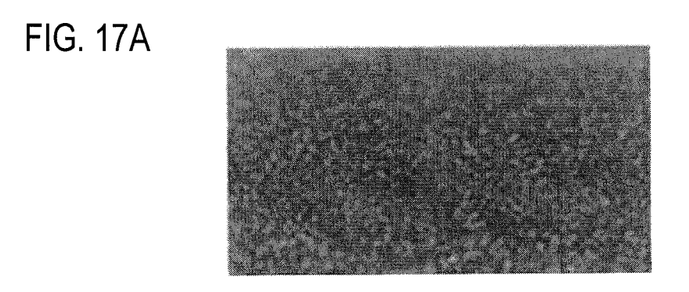
FIGS. 17A to 17D are optical microscopic images upon dropping pure water.

In ambient air, the state at the bottom of the concave portion of the heat spreader in Example 1 was observed when 20 µl of pure water was dropped to be bottom (refer to FIG. 17A). As a comparative example, when 20 µl of pure water was dropped to the surface of each of a copper plate (refer to FIG. 17B), a sintered body of copper powder (refer to FIG. 17C), and a sintered body of a copper oxide powder (refer to FIG. 17D) in ambient air, the state of each of the surfaces was observed.

Figure 17B:
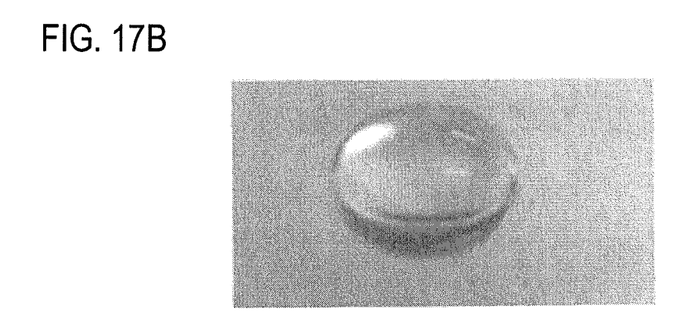
Figure 17C:
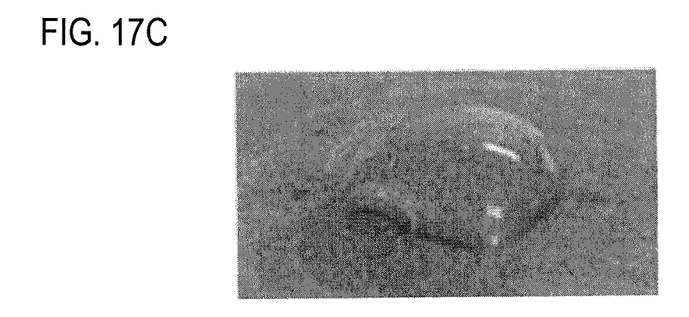
Figure 17D:
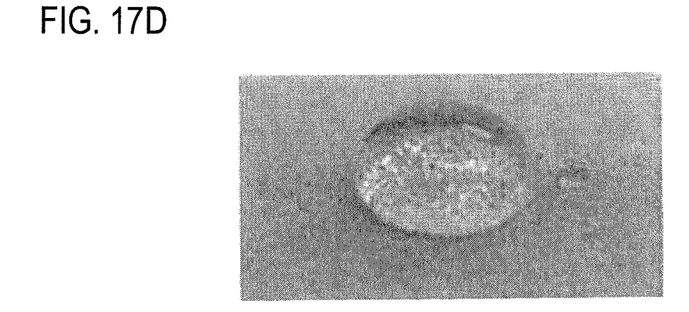
Figure 18:
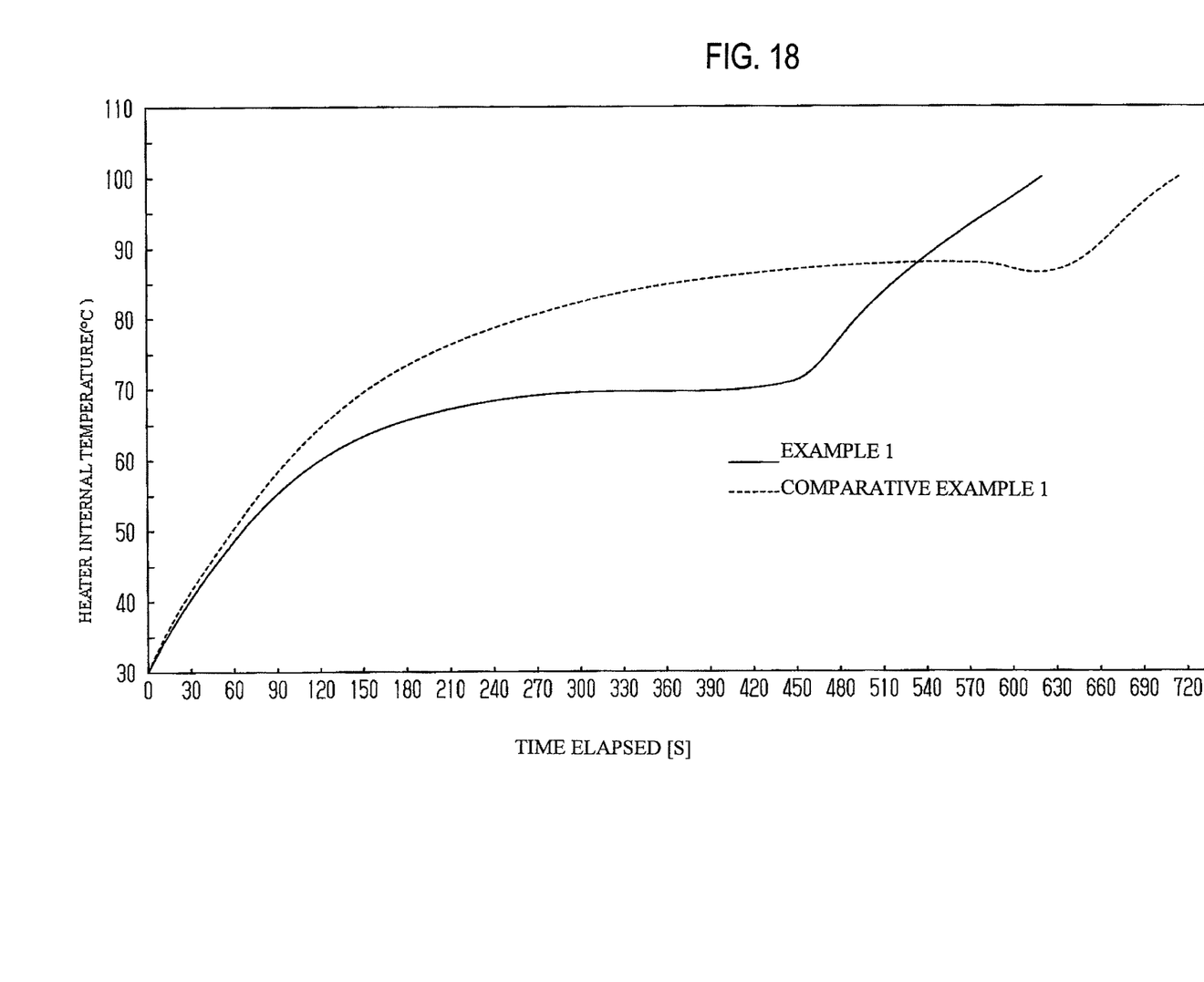
FIG. 18 is a graph showing the result of measuring thermal characteristic of latent heat of vaporization.

As apparent from FIGS. 17B to 17D, pure water was in a dome shape or a spherical shape on each of the surfaces, the angle of contact with dropped pure water was large, and wettability to pure water was poor in the comparative example. Further, in the comparative examples, an oxide film was formed instantly due to exposure in the ambient air and the wettability was further worsened by the oxide film.

On the contrary, in Example 1, dropped pure water was instantly sucked to the inside of the heat spreader and it was confirmed that the wettability to pure water, that is, the hydrophilicity was improved. This is considered that the hydrophilicity of the carbon nanotubes pulverized in the adhesion step was improved and, the carbon nanotubes were exposed at the bottom of the concave portion of the heat spreader. Further, in Example 1, deterioration of the wettability was not confirmed even when the same measurement was repeated in ambient air. That is, in Example 1, the surface of the heat spreader was not oxidized even when the surface was exposed to the ambient air. This is considered that oxidation is prevented mechanochemically by the carbon nanotubes present on the surface of the heat spreader.

<Measurement for Thermal Characteristic>

Comparative Example 1

A heat spreader made of copper sized 30×30 mm and having a thickness of 3 mm for the plate portion was used for the measurement.

(Measuring Method)

In a state of directing the bottom of the concave portion upward and opening the upper portion to ambient air in the heat spreader of each example, 1000 µl of pure water was dropped to the bottom of the concave portion at a room temperature. Then, a heater block in contact with the surface of the heat spreader on the side opposite to the bottom of the concave portion of the heat spreader was heated by a heater (100° C.), to measure the temperature change inside the heater block.

(Result of Measurement)

As apparent from FIG. 18, it can be seen that the temperature in a stable region, that is, a period in which the dropped water is evaporated (about 210 sec to 450 sec) is lower by 14° C. to 24° C. compared with that in Comparative Example 1, and the thermal characteristic is improved. Further, it can be seen that the time for completely evaporating the dropped pure water in Example 1 (about 450 sec) is greatly shortened and the heat dissipating efficiency is greatly improved compared with in Comparative Example 1.

What is claimed is:

1. A composite material, comprising:
a plurality of particles having a core-shell structure comprising:
    a core material that is a metal particle having a grain size from 40 μm to 3 mm;
    a first shell material surrounding the core material, wherein the first shell material is a metal having a fine crystal structure with grain size less than the grain size of the core material; and
    a second shell material having a thickness from 5 μm to 12 μm, surrounding the first shell material, wherein the second shell material is a metal-carbon composite comprising a carbon phase material in a metal matrix, and
    wherein the second shell material has a rough surface in which a carbon phase material having hydrophilic properties protrudes from the rough surface.

2. The composite material according to claim 1, wherein the rough surface of the second shell material comprises the carbon phase material and crystal grains of the metal matrix.

3. The composite material according to claim 1, wherein the the core material comprises a metal selected from the group consisting of copper, silver, gold, aluminum, indium, and an alloy containing at least one of the metals selected from the group.

4. The composite material according to claim 1, wherein the carbon phase material is at least one material selected from the group consisting of carbon nanotubes, graphite, graphene, fullerene, and nanodiamond.

5. A heat dissipating component, comprising:
a composite material adhered to a surface or an inner wall surface of the heat dissipating component,
wherein the composite material comprises an aggregate of particles having a core-shell structure comprising:
    a core material that is a metal particle having a grain size from 40 μm to 3 mm;
    a first shell material surrounding the core material, wherein the first shell material is a metal having a fine crystal structure with grain size less than the grain size of the core material; and
    a second shell material having a thickness from 5 μm to 12 μm, surrounding the first shell material, wherein the second shell material is a metal-carbon composite comprising a carbon phase material in a metal matrix, and
    wherein the second shell material has a rough surface in which a carbon phase material having hydrophilic properties protrudes from the rough surface.

6. The heat dissipating component according to claim 5, wherein the rough surface of the second shell material comprises the carbon phase material and crystal grains of the metal matrix.

7. The heat dissipating component according to claim 5, wherein the core material comprises a metal selected from the group consisting of copper, silver, gold, aluminum, indium, and an alloy containing at least one of the metals selected from the group described above.

8. The heat dissipating component according to claim 5, wherein the carbon phase material is at least one material selected from the group consisting of carbon nanotubes, graphite, graphene, fullerene, and nanodiamond.

* * * * *